(12) United States Patent
Lin et al.

(10) Patent No.: US 9,082,780 B2
(45) Date of Patent: Jul. 14, 2015

(54) SEMICONDUCTOR DEVICE AND METHOD OF FORMING A ROBUST FAN-OUT PACKAGE INCLUDING VERTICAL INTERCONNECTS AND MECHANICAL SUPPORT LAYER

(75) Inventors: Yaojian Lin, Singapore (SG); Kang Chen, Singapore (SG); Yu Gu, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 113 days.

(21) Appl. No.: 13/428,439

(22) Filed: Mar. 23, 2012

(65) Prior Publication Data

US 2013/0249106 A1   Sep. 26, 2013

(51) Int. Cl.
| | | |
|---|---|---|
| H01L 21/00 | (2006.01) | |
| H01L 21/56 | (2006.01) | |
| H01L 23/498 | (2006.01) | |
| H01L 23/00 | (2006.01) | |
| H01L 25/10 | (2006.01) | |
| H01L 23/538 | (2006.01) | |

(52) U.S. Cl.
CPC ............ *H01L 21/563* (2013.01); *H01L 21/568* (2013.01); *H01L 23/49811* (2013.01); *H01L 23/49816* (2013.01); *H01L 23/49822* (2013.01); *H01L 23/49894* (2013.01); *H01L 23/5389* (2013.01); *H01L 24/19* (2013.01); *H01L 25/105* (2013.01); *H01L 2224/32225* (2013.01); *H01L 2224/48225* (2013.01); *H01L 2224/73267* (2013.01); *H01L 2224/97* (2013.01); *H01L 2225/1035* (2013.01); *H01L 2225/1058* (2013.01); *H01L 2924/12041* (2013.01); *H01L 2924/1306* (2013.01); *H01L 2924/13091* (2013.01)

(58) Field of Classification Search
CPC ................ H01L 2225/49816; H01L 23/488; H01L 24/11; H01L 21/76883; H01L 2224/48225; H01L 2224/32225
USPC .......... 438/126, 127, 108, 109, 613; 228/180.22
See application file for complete search history.

(56) References Cited

U.S. PATENT DOCUMENTS

| | | | |
|---|---|---|---|
| 6,187,615 B1 | 2/2001 | Kim et al. | |
| 6,194,250 B1 * | 2/2001 | Melton et al. | 438/126 |
| 6,229,702 B1 * | 5/2001 | Tao et al. | 361/704 |
| 6,268,568 B1 * | 7/2001 | Kim | 174/250 |
| 6,696,644 B1 | 2/2004 | Chiu et al. | |
| 6,815,263 B2 * | 11/2004 | Rissing et al. | 438/127 |
| 6,847,109 B2 * | 1/2005 | Shim | 257/697 |
| 6,870,274 B2 * | 3/2005 | Huang | 257/780 |

(Continued)

*Primary Examiner* — David Zarneke
(74) *Attorney, Agent, or Firm* — Roberty D. Atkins; Atkins and Associates, P.C.

(57) ABSTRACT

A semiconductor device has a semiconductor die. An encapsulant is deposited around the semiconductor die. An interconnect structure having a conductive bump is formed over the encapsulant and semiconductor die. A mechanical support layer is formed over the interconnect structure and around the conductive bump. The mechanical support layer is formed over a corner of the semiconductor die and over a corner of the interconnect structure. An opening is formed through the encapsulant that extends to the interconnect structure. A conductive material is deposited within the opening to form a conductive through encapsulant via (TEV) that is electrically connected to the interconnect structure. A semiconductor device is mounted to the TEV and over the semiconductor die to form a package-on-package (PoP) device. A warpage balance layer is formed over the encapsulant opposite the interconnect structure.

25 Claims, 13 Drawing Sheets

(56) References Cited

U.S. PATENT DOCUMENTS

| | | | |
|---|---|---|---|
| 6,943,057 B1 * | 9/2005 | Shim et al. | 438/107 |
| 7,057,277 B2 * | 6/2006 | Chen et al. | 257/707 |
| 7,262,080 B2 * | 8/2007 | Go et al. | 438/109 |
| 7,278,746 B2 * | 10/2007 | Matthys et al. | 353/94 |
| 7,332,821 B2 * | 2/2008 | Bernier et al. | 257/780 |
| 7,371,617 B2 * | 5/2008 | Tsai et al. | 438/124 |
| 7,423,337 B1 | 9/2008 | Patwardhan et al. | |
| 7,452,747 B2 * | 11/2008 | Chan et al. | 438/106 |
| 7,579,217 B2 * | 8/2009 | Zhao et al. | 438/122 |
| 7,671,457 B1 * | 3/2010 | Hiner et al. | 257/678 |
| 7,777,351 B1 * | 8/2010 | Berry et al. | 257/778 |
| 8,035,035 B2 * | 10/2011 | Asano | 174/255 |
| 8,035,213 B2 * | 10/2011 | Lee et al. | 257/692 |
| 8,143,097 B2 * | 3/2012 | Chi et al. | 438/107 |
| 8,163,597 B2 * | 4/2012 | Huang et al. | 438/106 |
| 8,169,067 B2 * | 5/2012 | Law et al. | 257/690 |
| 8,258,018 B2 * | 9/2012 | Tanoue | 438/126 |
| 8,304,904 B2 * | 11/2012 | Lin et al. | 257/737 |
| 8,319,338 B1 * | 11/2012 | Berry et al. | 257/738 |
| 8,341,835 B1 * | 1/2013 | Huemoeller et al. | 29/841 |
| 8,471,394 B2 * | 6/2013 | Jang et al. | 257/787 |
| 8,502,387 B2 * | 8/2013 | Choi et al. | 257/774 |
| 8,508,954 B2 * | 8/2013 | Kwon et al. | 361/790 |
| 8,525,318 B1 * | 9/2013 | Kim et al. | 257/686 |
| 8,541,260 B1 * | 9/2013 | Darveaux et al. | 438/106 |
| 8,546,194 B2 * | 10/2013 | Choi et al. | 438/127 |
| 8,592,992 B2 * | 11/2013 | Lin et al. | 257/774 |
| 8,623,753 B1 * | 1/2014 | Yoshida et al. | 438/613 |
| 8,624,374 B2 * | 1/2014 | Ding et al. | 257/686 |
| 2007/0018322 A1 | 1/2007 | Park et al. | |
| 2007/0290376 A1 * | 12/2007 | Zhao et al. | 257/787 |
| 2008/0230887 A1 * | 9/2008 | Sun et al. | 257/686 |
| 2009/0096098 A1 | 4/2009 | Yang et al. | |
| 2011/0227220 A1 * | 9/2011 | Chen et al. | 257/738 |
| 2011/0241193 A1 * | 10/2011 | Ding et al. | 257/686 |
| 2011/0278736 A1 | 11/2011 | Lin et al. | |
| 2011/0278741 A1 * | 11/2011 | Chua et al. | 257/777 |
| 2012/0228782 A1 * | 9/2012 | Kawata et al. | 257/777 |
| 2013/0001767 A1 * | 1/2013 | Kajiki | 257/734 |
| 2013/0200528 A1 * | 8/2013 | Lin et al. | 257/774 |
| 2014/0027929 A1 * | 1/2014 | Lin et al. | 257/774 |
| 2014/0048906 A1 * | 2/2014 | Shim et al. | 257/531 |

* cited by examiner

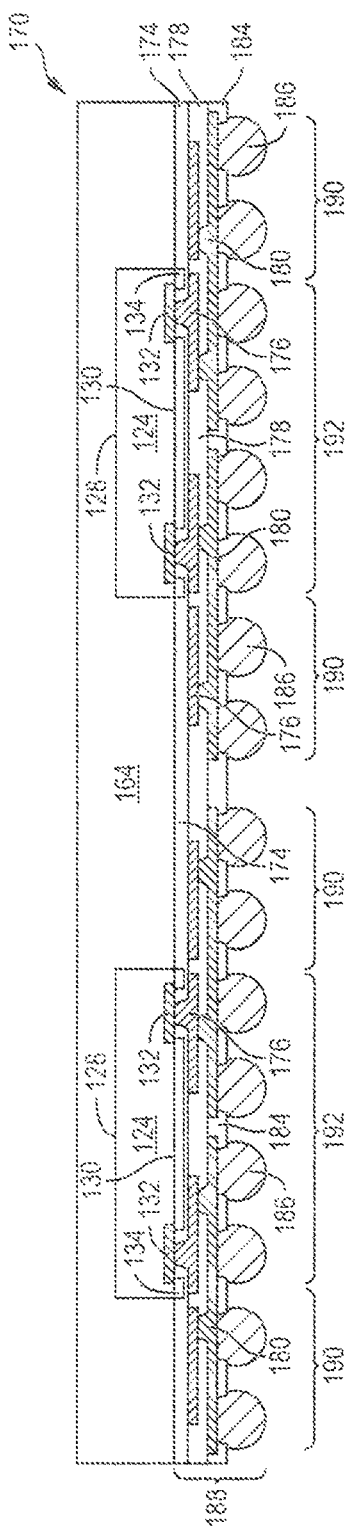
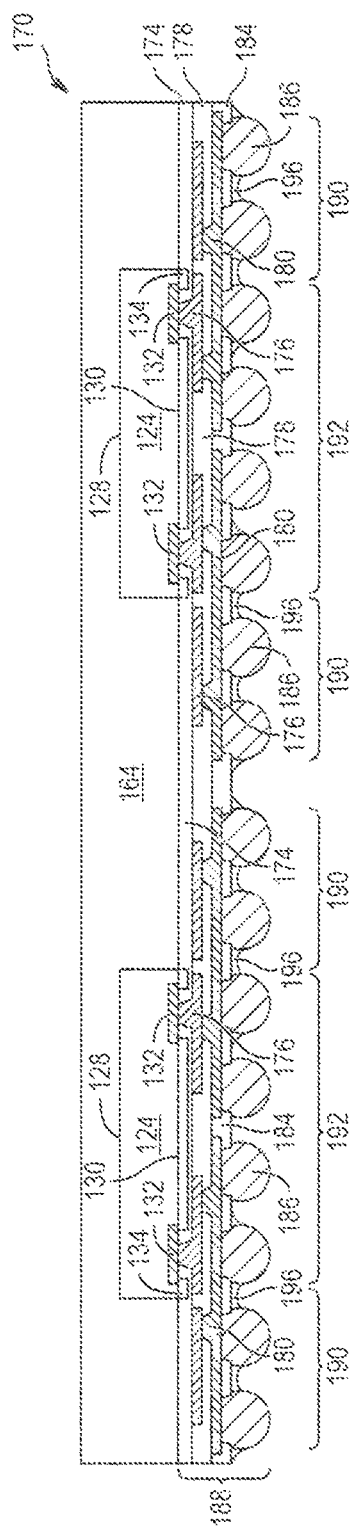
FIG. 4g
FIG. 4h

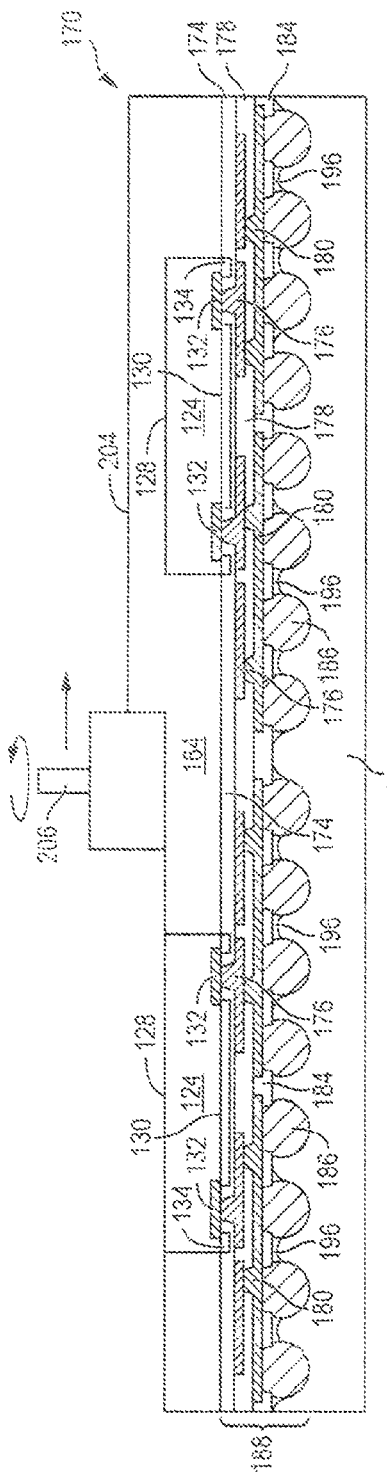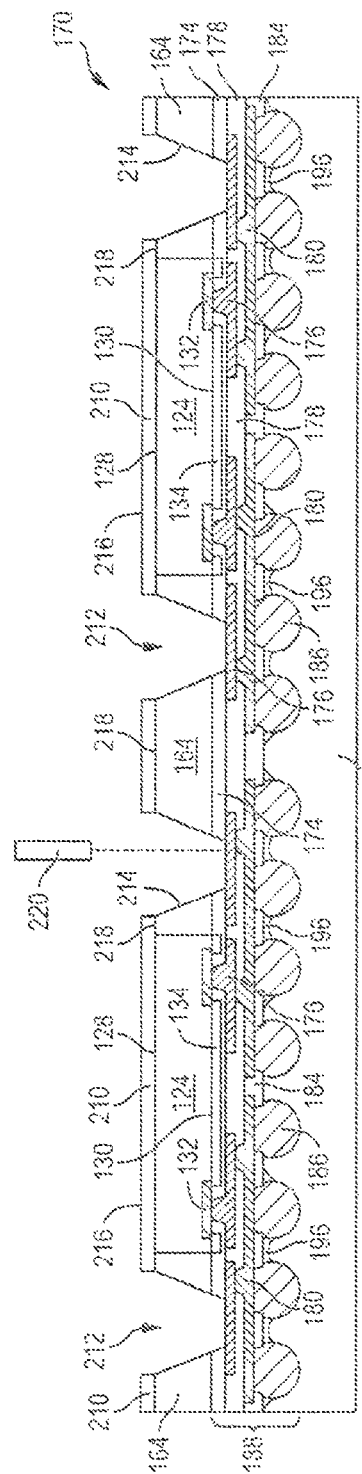

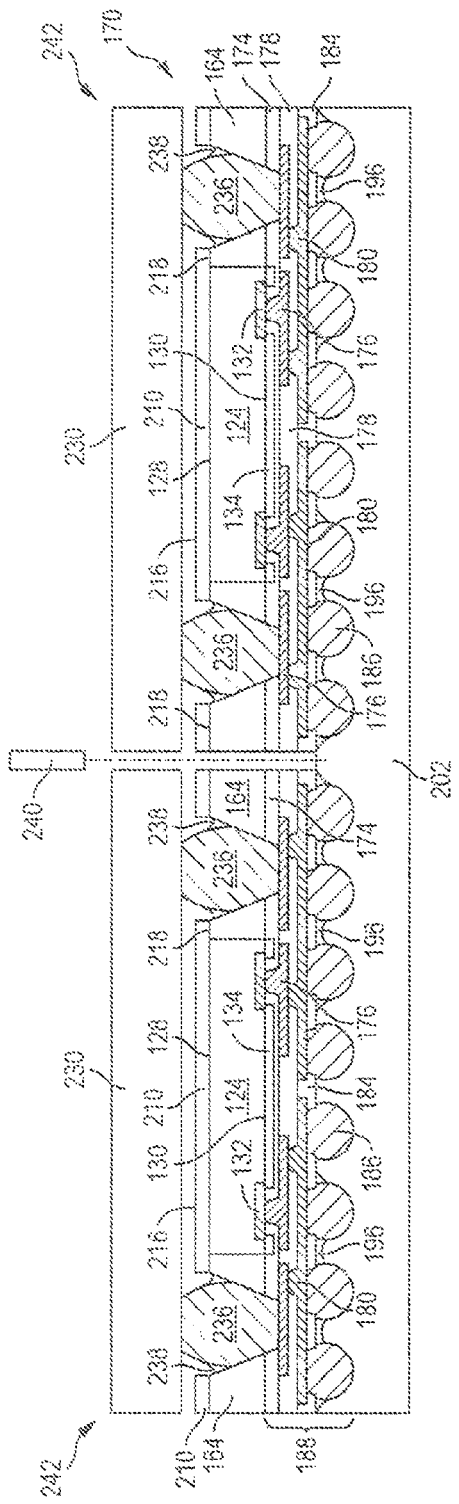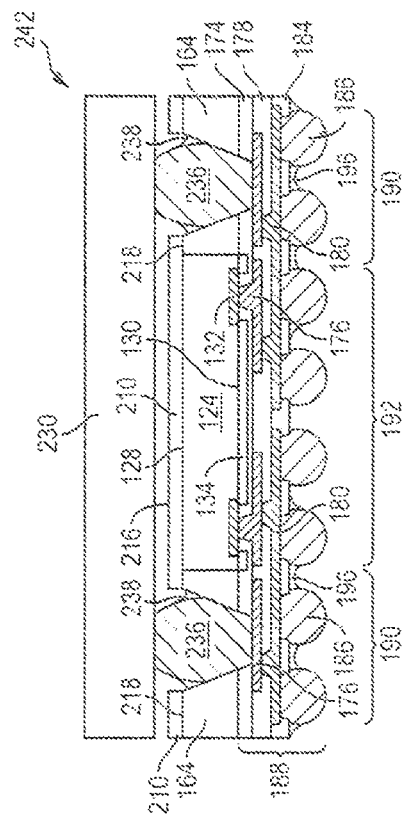
FIG. 4n
FIG. 5

SEMICONDUCTOR DEVICE AND METHOD OF FORMING A ROBUST FAN-OUT PACKAGE INCLUDING VERTICAL INTERCONNECTS AND MECHANICAL SUPPORT LAYER

FIELD OF THE INVENTION

The present invention relates in general to semiconductor devices and, more particularly, to a semiconductor device and method of forming a robust fan-out package including vertical interconnects and a mechanical support layer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The electrical interconnection between a FO-WLCSP containing semiconductor devices on multiple levels (3-D device integration) and external devices can be accomplished with conductive through silicon vias (TSV) or through hole vias (THV). In most TSVs and THVs, the sidewalls and bottomside of the via are conformally plated with conductive materials to enhance adhesion. The TSVs and THVs are then filled with another conductive material, for example, by copper deposition through an electroplating process. The TSV and THV formation typically involves considerable time for the via filling, which reduces the unit-per-hour (UPH) production schedule. The equipment need for electroplating, e.g., plating bath, and sidewall passivation increases manufacturing cost. In addition, voids may be formed within the vias, which causes defects and reduces reliability of the device. TSV and THV can be a slow and costly approach to make vertical electrical interconnections in semiconductor packages. These interconnect schemes also have problems with semiconductor die placement accuracy, warpage control before and after removal of the carrier, and process cost management.

The electrical interconnection between 3-D FO-WLCSPs and external devices, in addition to including TSVs and THVs, further includes redistribution layers (RDLs). RDLs serve as intermediate layers for electrical interconnect within a package including electrical interconnect with package I/O pads which provide electrical connection from semiconductor die within 3-D FO-WLCSP to points external to 3-D FO-WLCSPs. RDLs can be formed over both a front side and a backside of a semiconductor die within a 3-D FO-WLCSP. However, the formation of multiple RDLs including over a front side and backside of a semiconductor die can be a slow and costly approach for making electrical interconnection for 3-D FO-WLCSPs and can result in higher fabrication costs. Additionally, thin stacks of redistribution layers include structural limitations such as providing limited mechanical strength for package processing and reliability.

SUMMARY OF THE INVENTION

A need exists for forming robust fan-out packages with vertical interconnects. Accordingly, in one embodiment, the present invention is a method of making a semiconductor device comprising the steps of providing a semiconductor die, depositing an encapsulant around the semiconductor die, forming an interconnect structure having a conductive bump over the encapsulant and semiconductor die, forming a mechanical support layer over the interconnect structure and around the conductive bump, forming an opening through the encapsulant that extends to the interconnect structure, and depositing conductive material within the opening to form a conductive through encapsulant via (TEV) electrically connected to the interconnect structure.

In another embodiment, the present invention is a method of making a semiconductor device comprising the steps of providing a semiconductor die, depositing an encapsulant around the semiconductor die, forming an interconnect structure having a conductive bump over the encapsulant and semiconductor die, forming a mechanical support layer over the interconnect structure and around the conductive bump, and forming a through encapsulant via (TEV) through the encapsulant and electrically connected to the interconnect structure.

In another embodiment, the present invention is a method of making a semiconductor device comprising the steps of providing a semiconductor die, depositing an encapsulant around the semiconductor die, forming an interconnect structure over the encapsulant and semiconductor die, and forming a mechanical support layer over the interconnect structure.

In another embodiment, the present invention is a semiconductor device comprising a semiconductor die. An encapsulant is deposited around the semiconductor die. An interconnect structure is formed over the encapsulant and semiconductor die. A mechanical support layer is formed over the interconnect structure. A through encapsulant via (TEV) is formed through the encapsulant and electrically connected to the interconnect structure.

BRIEF DESCRIPTION OF THE DRAWINGS

FIG. 5 illustrates a robust fan-out package on package (fo-PoP) device;

DETAILED DESCRIPTION OF THE DRAWINGS

Figure 1:
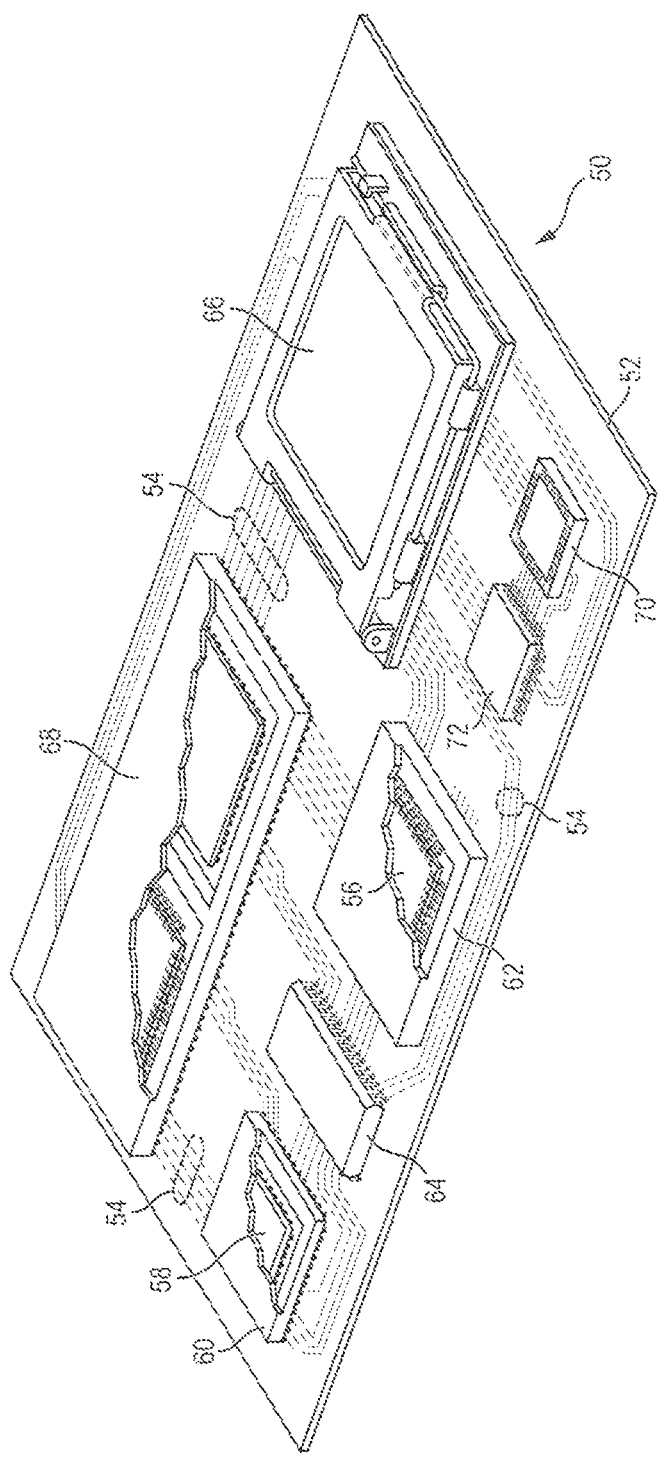
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
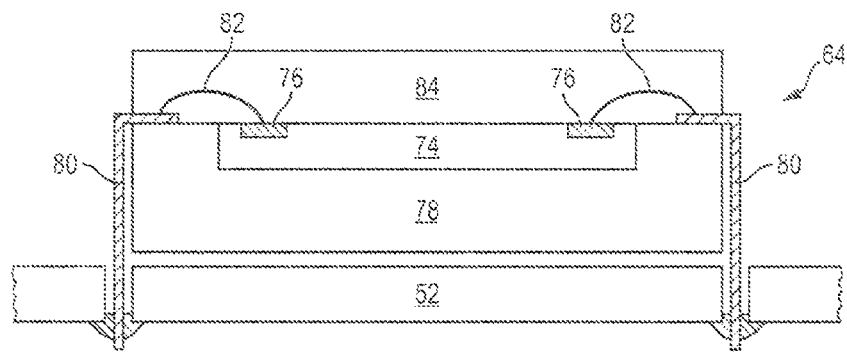
FIGS. 2a-2c illustrate further detail of the representative semiconductor packages mounted to the PCB.
Figure 2B:
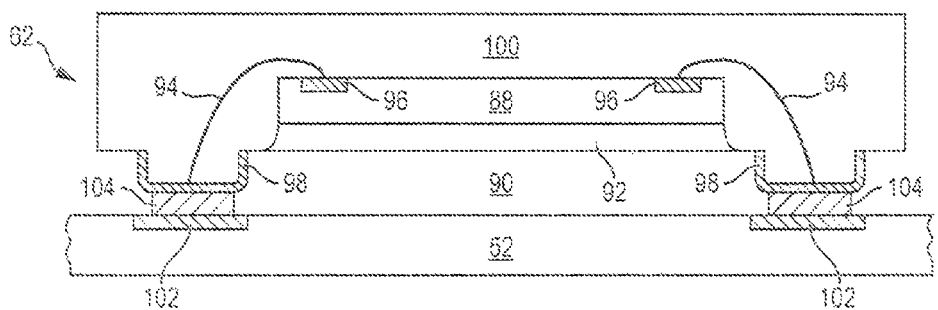
Figure 2C:
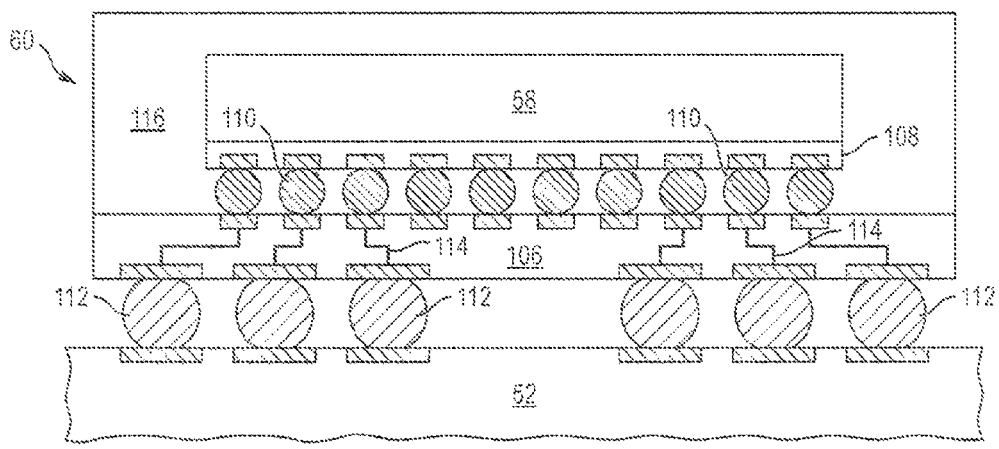

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
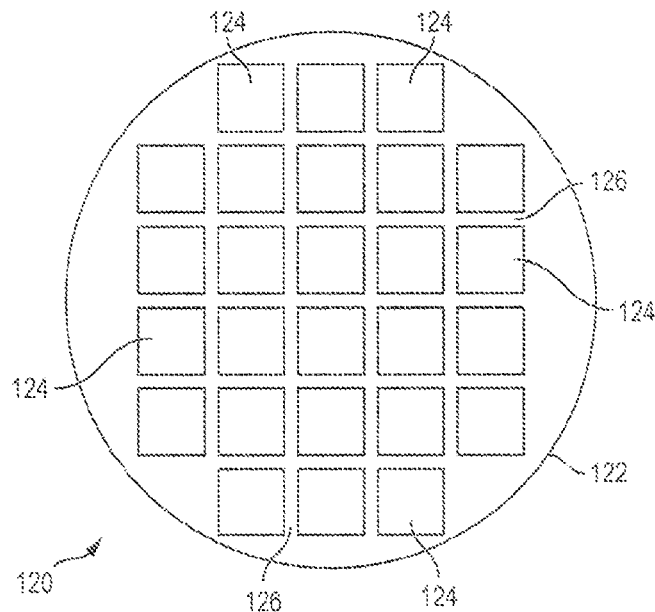
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
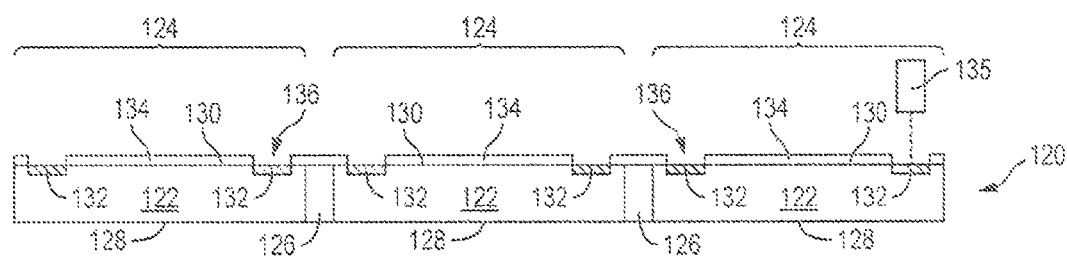

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are in multiple rows such that a first row of contact pads is disposed a first distance from the edge of the die, and a second row of contact pads alternating with the first row is disposed a second distance from the edge of the die.

An insulating or passivation layer 134 is conformally applied over active surface 130 using PVD, CVD, screen printing, spin coating, spray coating, sintering or thermal oxidation. Insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Insulating layer 134 covers and provides protection for active surface 130. A portion of insulating layer 134 is removed by laser direct ablation (LDA) using laser 135 or other suitable process to expose conductive layer 132 and provide for subsequent electrical interconnect.

Figure 3C:
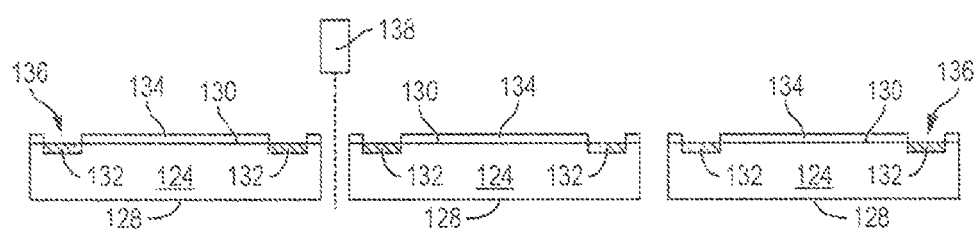

In FIG. 3c, semiconductor wafer 120 is singulated through saw street 126 using a saw blade or laser cutting tool 138 into individual semiconductor die 124.

Figure 4A:
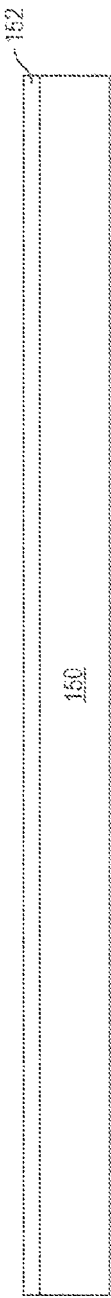
FIGS. 4a-4n illustrate a process of forming a robust fan-out package.

FIGS. 4a-4n illustrate, in relation to FIGS. 1 and 2a-2c, a process of forming a robust fan-out PoP device with vertical interconnects and a mechanical support layer. FIG. 4a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer.

Figure 4B:
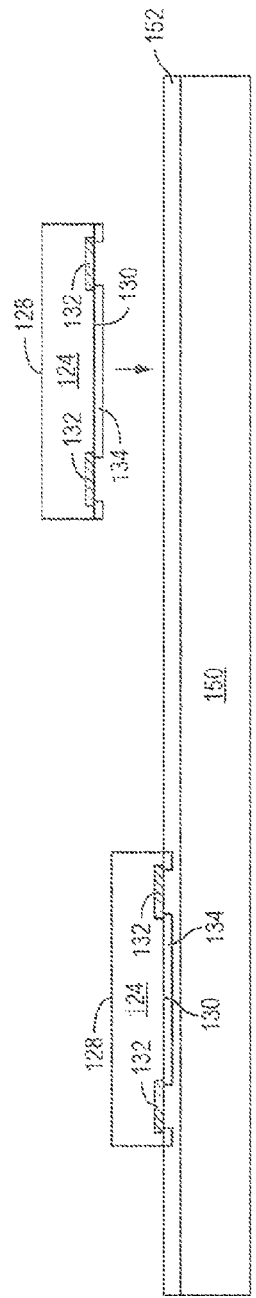

In FIG. 4b, semiconductor die 124 from FIG. 3c are mounted to interface layer 152 and over carrier 150 using, for example, a pick and place operation with active surface 130 oriented toward the carrier. Semiconductor die 124 are pressed into interface layer 152 such that a portion of insulating layer 134 is disposed within and surrounded by the interface layer.

Figure 4C:
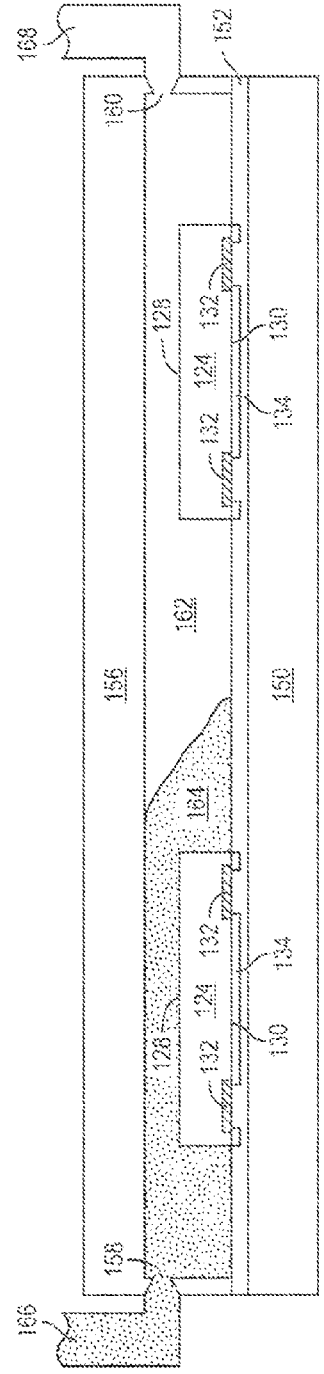

In FIG. 4c, carrier 150 and semiconductor die 124 are placed in a chase mold 156 having a plurality of inlets 158 and 160, and a cavity 162. Carrier 150 is placed into chase mold 156 so that semiconductor die 124 are disposed within cavity 162. A volume of encapsulant or molding compound 164 is injected from dispenser 166 under an elevated temperature and pressure through inlet 158 into cavity 162, over and around semiconductor die 124, and over carrier 150. Inlet 160 can be an exhaust port with optional vacuum assist 168 for excess encapsulant 164. Encapsulant 164 can be a polymer composite material, such as epoxy resin with filler, epoxy acrylate with filler, or polymer with proper filler. Encapsulant 164 is non-conductive, provides physical support, and environmentally protects semiconductor die 124 from external elements and contaminants. A volume of encapsulant 164 is measured according to the space requirements of cavity 162 less the area occupied by semiconductor die 124. Encapsulant 164 is evenly dispersed and uniformly distributed under an elevated temperature within cavity 162 and around semiconductor die 124.

Figure 4D:
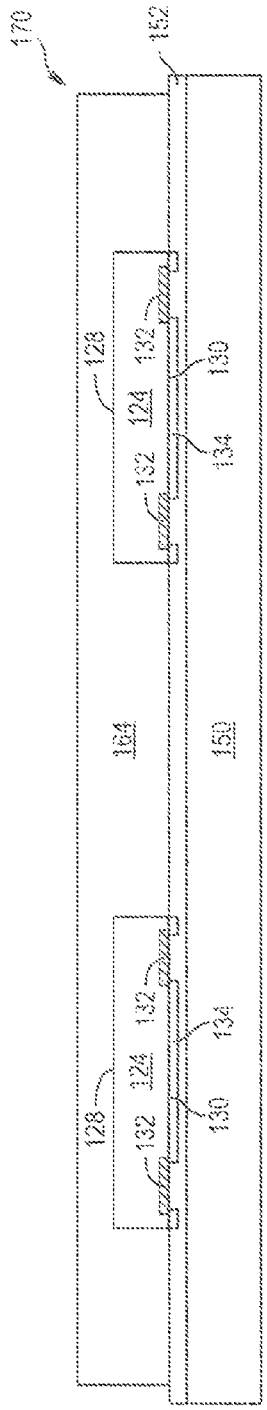

FIG. 4d shows composite substrate or reconstituted wafer 170 covered by encapsulant 164. Encapsulant 164 can be formed over composite substrate 170 in a chase mold as depicted in FIG. 4c and recited in the supporting text. Alternatively, encapsulant 164 can be formed over composite substrate 170 using a paste printing, compressive molding, transfer molding, liquid encapsulant molding, vacuum lamination, or other suitable applicator. Encapsulant 164 is formed over back surface 128 of semiconductor die 124, and can be thinned in a subsequent backgrinding step. Encapsulant 164 can also be deposited such that the encapsulant is coplanar with back surface 128, and does not cover the back surface. In either case, encapsulant 164 facilitates the subsequent formation of through vertical interconnects around a periphery of semiconductor die 124.

Figure 4E:
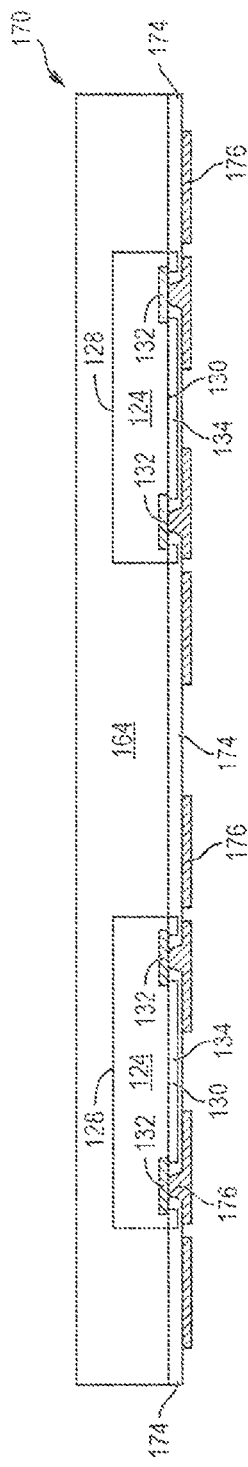

In FIG. 4e, carrier 150 and interface layer 152 are removed from composite substrate 170 by chemical etching, mechanical peeling, chemical mechanical planarization (CMP), mechanical grinding, thermal bake, UV light, laser scanning, or wet stripping to facilitate the formation of an interconnect structure over active surface 130 of semiconductor die 124 and encapsulant 164 around a periphery of the semiconductor die.

FIG. 4e also shows a first portion of a fan-out PoP interconnect or RDL is formed by the deposition and patterning of insulating or passivation layer 174. Insulating layer 174 is conformally applied to, and has a first surface that follows the contours of, encapsulant 164, insulating layer 134, and semiconductor die 124. Insulating layer 174 has a second planar surface opposite the first surface. Insulating layer 174 contains one or more layers of low temperature curable polymer dielectric resist (i.e., cures at less than 260 degrees Celsius (C)) with or without filler, SiO2, Si3N4, SiON, Ta2O5, Al2O3, or other material having similar insulating and structural properties. Insulating layer 174 is deposited using PVD, CVD, printing, spin coating, spray coating, sintering, thermal oxidation, or other suitable process. A portion of insulating layer 174 is removed by an exposure or development process, LDA, etching, or other suitable process to form openings over conductive layer 132. The openings expose conductive layer 132 of semiconductor die 124 for subsequent electrical interconnect.

An electrically conductive layer 176 is patterned and deposited over insulating layer 174, over semiconductor die 124, and disposed within the openings in insulating layer 174 to fill the openings and contact conductive layer 132 as one or more layers, including seed layers. The one or more layers of conductive layer 176 include Al, Cu, Sn, Ni, Au, Ag, titanium (Ti)/Cu, titanium tungsten (TiW)/Cu, Ti/nickel vanadium (NiV)/Cu, TiW/NiV/Cu, or other suitable electrically conductive material. The deposition of conductive layer 176 uses PVD, CVD, electrolytic plating, electroless plating, or other suitable process. In one embodiment, the deposition of conductive layer 176 includes selective plating with a seed layer and lithography. Conductive layer 176 operates as an RDL to fan-out and extend electrical connection from semiconductor die 124 to points external to semiconductor die 124.

Figure 4F:
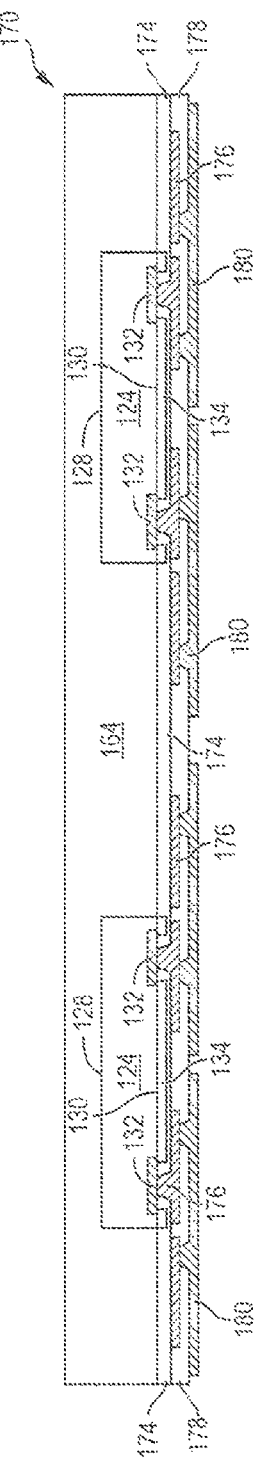

In FIG. 4f, an insulating or passivation layer 178 is conformally applied to, and follows the contours of, insulating layer 174 and conductive layer 176. Insulating layer 178 contains one or more layers of low temperature curable polymer dielectric resist (i.e., cures at less than 260 degrees C.) with or without filler, SiO2, Si3N4, SiON, Ta2O5, Al2O3, or other material having similar insulating and structural properties. Insulating layer 178 is deposited using PVD, CVD, printing, spin coating, spray coating, sintering, thermal oxidation, or other suitable process. A portion of insulating layer 178 is removed by an exposure or development process, LDA, etching, or other suitable process to form openings in the insulating layer, which expose portions of conductive layer 176 for subsequent electrical interconnection.

FIG. 4f also shows an electrically conductive layer 180 is patterned and deposited over insulating layer 178, over conductive layer 176, and disposed within the openings in insulating layer 178 as one or more layers, including seed layers, to fill the openings and contact conductive layer 176. The one or more layers of conductive layer 180 include Al, Cu, Sn, Ni, Au, Ag, Ti/Cu, TiW/Cu, Ti/NiV/Cu, TiW/NiV/Cu, or other suitable electrically conductive material. The deposition of conductive layer 180 uses PVD, CVD, electrolytic plating, electroless plating, or other suitable process. In one embodiment, the deposition of conductive layer 176 includes selective plating with a seed layer and lithography. Conductive layer 180 operates as an RDL to fan-out and extend electrical connection from semiconductor die 124 to points external to semiconductor die 124.

In FIG. 4g, an insulating or passivation layer 184 is conformally applied to, and follows the contours of, insulating layer 178 and conductive layer 180. Insulating layer 184 contains one or more layers of low temperature curable polymer dielectric resist (i.e., cures at less than 260 degrees Celsius (C)) with or without filler, SiO2, Si3N4, SiON, Ta2O5, Al2O3, or other material having similar insulating and structural properties. Insulating layer 184 is deposited using PVD, CVD, printing, spin coating, spray coating, sintering, thermal oxidation, or other suitable process. A portion of insulating layer 184 is removed by an exposure or development process, LDA, etching, or other suitable process to form openings in the insulating layer, which expose portions of conductive layer 180 for subsequent electrical interconnection.

FIG. 4g also shows an electrically conductive bump material is deposited over conductive layer 180 and within the openings in insulating layer 184 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 180 using a suitable attachment or bonding process. In one embodiment, the bump material is reflowed by heating the material above its melting point to form spherical balls or bumps 186. In some applications, bumps 186 are reflowed a second time to improve electrical contact to conductive layer 180. In one embodiment, bumps 186 are formed over a UBM having a wetting layer, barrier layer, and adhesive layer. The bumps can also be compression bonded to conductive layer 180. Bumps 186 represent one type of interconnect structure that can be formed over conductive layer 180. The interconnect structure can also use bond wires, conductive paste, stud bump, micro bump, or other electrical interconnect.

Taken together, insulating layers 174, 178, and 184 as well as conductive layers 176, 180, and conductive bumps 186 form interconnect structure 188. The number of insulating and conductive layers included within interconnect structure 188 depends on, and varies with, the complexity of the circuit routing design. Accordingly, interconnect structure 188 can include any number of insulating and conductive layers to facilitate electrical interconnect with respect to semiconductor die 124. Elements that would otherwise be included in a backside interconnect structure or RDL can be integrated as part of interconnect structure 188 to simplify manufacturing and reduce fabrication costs with respect to a package including both front side and backside interconnects or RDLs.

Interconnect structure 188 includes a first area 190 that includes TEV zones. The TEV zones are areas in which subsequently formed vertical interconnects or vias extend through encapsulant 164 to contact interconnect structure 188. First area 190 is disposed over encapsulant 164 and is outside a footprint of semiconductor die 124 at a surface of the interconnect structure. Interconnect structure 188 also includes a second area 192 that is disposed at the surface of interconnect structure 188 adjacent to area 190 and within the footprint of semiconductor die 124. Accordingly, area 190 includes an entire surface of interconnect structure 188 for a fan-out package or area not included within area 192.

In FIG. 4h, mechanical support layer 196 is formed over interconnect structure 188 and around bumps 186 using printing, spin coating, spray coating, screen printing, stencil printing, jetting, lamination, or other suitable process. An optional cleaning process such as a laser clean, dry plasma, or wet development may also be used. Materials of mechanical support layer 196 include one or more layers of photosensitive polymer dielectric film with or without fillers, photosensitive composite resist, non-photosensitive polymer dielectric film, liquid crystal polymer (LCP), laminate compound film, insulation paste with filler, liquid molding compound, granular molding compound, polyimide, polymer flux, underfill or other material having similar insulating and structural properties.

Mechanical support layer 196 includes a first surface that is conformally applied to, and follows the contours of, interconnect structure 188. In one embodiment, a first surface of mechanical support layer 196 is substantially planar and contacts insulating layer 184. Mechanical support layer 196 includes a second surface opposite the first surface that is offset from the first surface by thickness of the mechanical support layer 196. The thickness of the mechanical support layer 196 or the distance between the first and second opposing surfaces of the mechanical support layer can be constant or vary. In one embodiment, a surface tension of mechanical support layer 196 causes the second surface of the mechanical support layer to be drawn toward a surface of bumps 186 such that the thickness of mechanical support layer 196 is increased around a periphery of bumps 186.

Mechanical support layer 196 provides structural support for the package, balances stress on the package, and reduces warping or cracking of the package. Mechanical support layer 196 enhances the mechanical base of interconnect structure 188, which as a thin stack of redistribution layers can be insufficient for providing good package reliability and package support during manufacturing. Mechanical support layer 196 is made of materials that have the properties of good adhesion with insulating layer 184 and bumps 186, have low shrinkage, and have coefficients of thermal expansion (CTE) similar to those of interconnect structure 188. In one embodiment, mechanical support layer 196 has a CTE in a range of 15-80 ppm/degree C. Mechanical support layer 196 is selectively applied and formed over interconnect structure 188 in areas that require additional mechanical strength or support for processing and reliability. Accordingly, mechanical support layer 196 is only disposed in designated areas and is not blanket deposited and left to cover an entire surface of areas 190 and 192. Common areas for the formation of mechanical support layer 196 generally include around a periphery of semiconductor die 124 in area 190, and more particularly within a footprint of where subsequently formed TEVs or through mold vias (TMVs) will extend through encapsulant 164 to a landing support area on conductive layer 176. Mechanical support layer 196 is also commonly formed at corner regions of semiconductor die 124 or area 192, at corner regions of the fan-out package or area 190, and at an interface between areas 190 and 192, i.e. along a perimeter of a footprint of the semiconductor die. By forming mechanical support layer 196 only over areas that require additional mechanical support for reliability and subsequent processing, a risk of increasing substrate warpage due to the presence of the mechanical support layer is minimized.

Figure 4I:
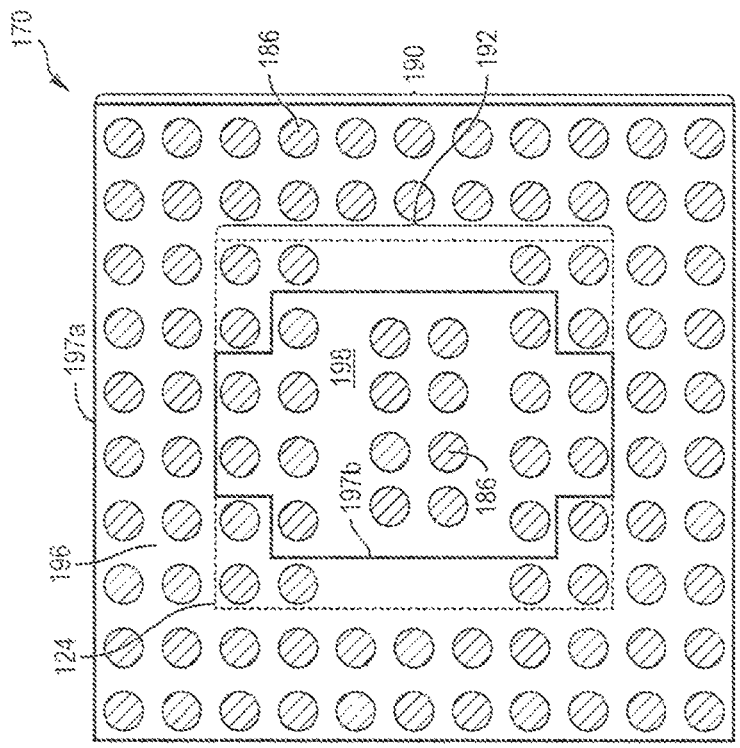
Figure 4I:
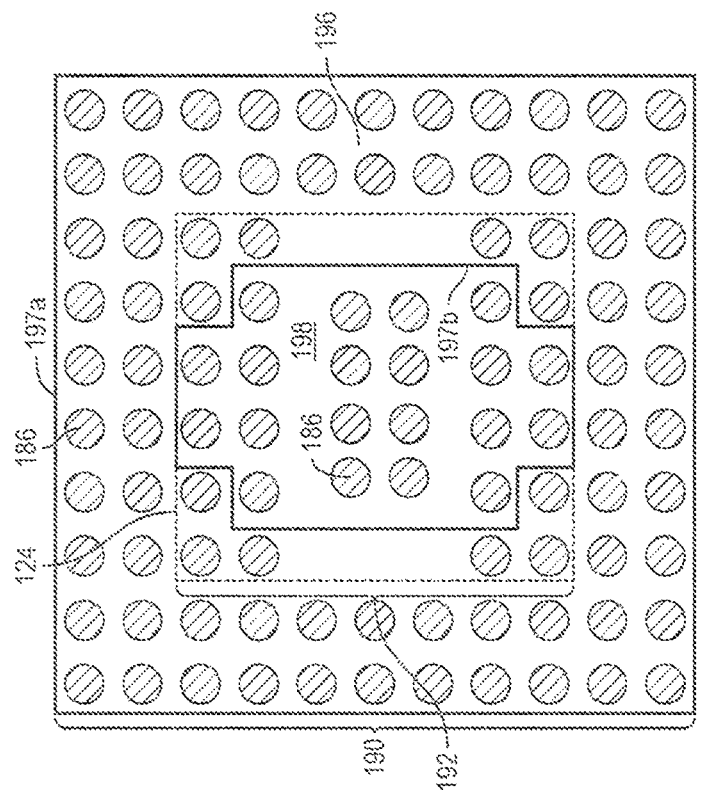

FIG. 4i shows a plan or top view of composite substrate 170 that corresponds to the cross-sectional view of composite substrate 170 shown previously in FIG. 4h. Mechanical support layer 196 is disposed within, and completely covers, area 190 while the mechanical support layer is further disposed within, but does not completely cover, a portion of area 192. Mechanical support layer 196 includes an outer perimeter or edge 197a and an inner perimeter or edge 197b that are configured such that mechanical support layer 196 is disposed between outer perimeter 197a and inner perimeter 197b. In one embodiment, outer perimeter 197a extends along an outer edge or footprint of the subsequently formed fo-PoP; and, inner perimeter 197b is included within area 192 such that a portion of perimeter 197b extends along an interface between areas 190 and 192. Accordingly, mechanical support layer 196 is disposed along the interface between areas 190 and 192, as well as at corners of area 192 for additional mechanical support during subsequent processing and for increased package reliability. A center portion 198 of area 192 is free of mechanical support layer 196 such that a risk of increasing substrate warpage is minimized.

In FIG. 4j, an optional carrier or temporary substrate 202 is disposed over interconnect structure 188. Carrier 202 includes a backgrinding tape, supporting tape, and other carriers containing sacrificial base material such as silicon, polymer, beryllium oxide, glass, or other suitable low-cost, rigid material for structural support. Carrier 202 can include an interface layer, double-sided tape, and openings configured to receive composite substrate or reconstituted wafer 170 and interconnect structure 188. Carrier 202 optionally provides additional support for subsequent processing steps of the fo-PoP structure as shown in FIGS. 4j-4n. Alternatively, the subsequent processing steps for the fo-PoP structure are performed without carrier 202, and the additional support required for subsequent processing is provided by mechanical support layer 196.

FIG. 4j further shows top surface 204 of encapsulant 164 opposite interconnect structure 188 undergoes a grinding operation with grinder 206 to planarize the surface and reduce a thickness of the encapsulant. After the grinding operation is completed a layer of encapsulant 164 covers back surface 128 of semiconductor wafer 124. Alternatively, the grinding operation removes a first portion of encapsulant 164 down to back surface 128 of semiconductor die 124 or even thins excess bulk material from the back surface of the semiconductor die. A chemical etch or CMP process can also be used to remove mechanical damage and planarize encapsulant 164. In one embodiment, after removal of a portion of encapsulant 164, the encapsulant has a thickness in a range of 100 to 400 micrometers (μm).

In FIG. 4k, warpage balance layer 210 is deposited over and contacts a back surface 128 of semiconductor die 124 and encapsulant 164 using printing, spin coating, spray coating, screen printing, lamination, a paste printing, compressive molding, transfer molding, liquid encapsulant molding, vacuum lamination, or other suitable applicator. Warpage balance layer 210 can be one or more layers of photosensitive polymer dielectric film with or without fillers, non-photosensitive polymer dielectric film, epoxy, epoxy resin, polymeric materials, polymer composite material such as epoxy resin with filler, epoxy acrylate with filler, or polymer with proper filler, thermoset plastic laminate, or other material having similar insulating and structural properties. Warpage balance layer 210 is non-conductive, provides physical support, controls overall package warpage, and environmentally protects semiconductor die 124 from external elements and contaminants. Warpage balance layer 210 provides structural support for the package, balances stress on the package, and reduces warping or cracking of the package during subsequent handling and processing. Warpage characteristics of warpage balance layer 210, including thickness of the warpage balance layer and material properties, are adjusted according to overall package configuration and design, including a quantity and location of mechanical support layer 196. In one embodiment, warpage balance layer 210 has a thickness in a range of 10 to 80 μm and a CTE in a range of 30 to 120 ppm/degree C.

FIG. 4k also shows a portion of warpage balance layer 210 and a portion of encapsulant 164 is removed from around the periphery of semiconductor die 124 and over area 190 to form openings 212. Openings 212 include a vertical or sloped sidewall 214 and extend from a back surface 216 of warpage balance layer 210 completely through the encapsulant and insulating layer 174 to conductive layer 176. In one embodiment, openings 212 include sidewalls 214 with a first portion that is sloped, and second portion that is vertical. When warpage balance layer 210 is not formed over encapsulant 164, openings 212 extend from surface 218 of the encapsulant to conductive layer 176. Openings 212 are formed by drilling, laser ablation, high energy water jetting, etching, or other suitable process to expose portions of conductive layer 176. In one embodiment, openings 212 are formed by LDA using laser 220. Openings 212 are subsequently filled with conductive material to serve as TEVs or TMVs that extend to, and contact, conductive layer 176. Openings 212 have a footprint or cross-sectional area that is circular, oval, square, rectangular, or any other geometric shape. Openings 212 include footprints or cross-sectional areas that are constant or vary along a depth of the openings. Openings 212 are formed and subsequently cleaned with a wet or dry cleaning process while carrier 202 is attached over interconnect structure 188. By forming openings 212 as TEVs or TMVs through encapsulant 164 over area 190 and around the periphery of, or laterally offset from, semiconductor die 124, a portion of conductive layer 174 is exposed from a backside or surface 218 of encapsulant 164. Openings 212 are configured to provide subsequent 3-D electrical interconnect for semiconductor die 124 without the use of TSVs or THVs. The presence of mechanical support layer 196 enhances the mechanical base supporting the formation of openings 212 and supports stresses resulting from an offset between the TEVs and bumps 186 of interconnect structure 188. Mechanical support layer 196 also enhances the mechanical base supporting TEV interconnection during the formation of conductive TEVs, stacking of packages for a PoP structure, and singulation of composite substrate 170 into individual fo-PoP devices.

Figure 4L:
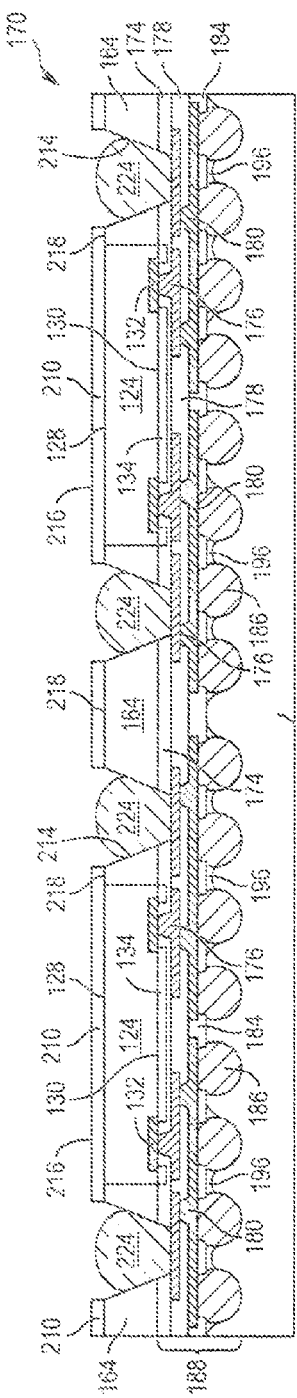

In FIG. 4l, an electrically conductive bump material is deposited in openings 212 and over interconnect structure 188 or conductive layer 176 using an evaporation, electrolytic plating, electroless plating, ball drop, screen printing, paste printing, jetting, or other suitable process. The bump material can be Al, Sn, Ni, Au, Ag, Pb, Bi, Cu, solder, and combinations thereof, with an optional flux solution. The flux solution is spin coated, stencil printed, or applied in a dipping process. The flux solution is non-clean flux with solvent, or a water clean flux. The bump material can be eutectic Sn/Pb, high-lead solder, or lead-free solder. The bump material is bonded to conductive layer 176 or interconnect structure 188 using a suitable attachment or bonding process. In one embodiment, the bump material is reflowed by heating the material above its melting point to form spherical balls or bumps 224. In some applications, bumps 224 are reflowed a second time to improve electrical contact to conductive layer 176. The bump material and bumps 224 can be reflowed with or without support from carrier 202 and with support from a separate carrier. In one embodiment, bumps 224 are formed over a UBM having a wetting layer, barrier layer, and adhesive layer. The bumps can also be compression bonded to conductive layer 176. Bumps 224 represent one type of interconnect structure that can be formed over conductive layer 176. The interconnect structure can also use bond wires, Cu, Ag, or other conductive paste, stud bump, micro bump, solder balls with a Cu core, Cu balls or columns with dipped solder paste or solder coating, or other electrical interconnect. Bumps 224 together with interconnect structure 188 and semiconductor die 124 form a 3D interconnection for next level interconnect. In one embodiment, bumps 224 are formed by surface mount technology (SMT) with paste printing deposited into openings 212 at the reconstituted wafer level.

After the formation of bumps 224, an optional polymer dielectric paste plugging may be applied over and around the bumps to provide additional support. The polymer dielectric paste plugging is applied through printing, spray coating, dipping, jetting, or other suitable process and is followed by an optional reflow or heat treatment under vacuum.

In one embodiment, after the formation of bumps 224, composite substrate or reconstituted wafer 170 is singulated into individual fo-packages. By singulating composite substrate 170 before mounting additional semiconductor devices over the composite substrate, the formation of fo-POP devices is accomplished by mounting the additional semiconductor devices to individual fo-packages rather than at the reconstituted wafer level. Alternatively, composite substrate 170 is singulated after additional semiconductor devices are mounted to the composite substrate as shown in FIGS. 4m and 4n.

Figure 4M:
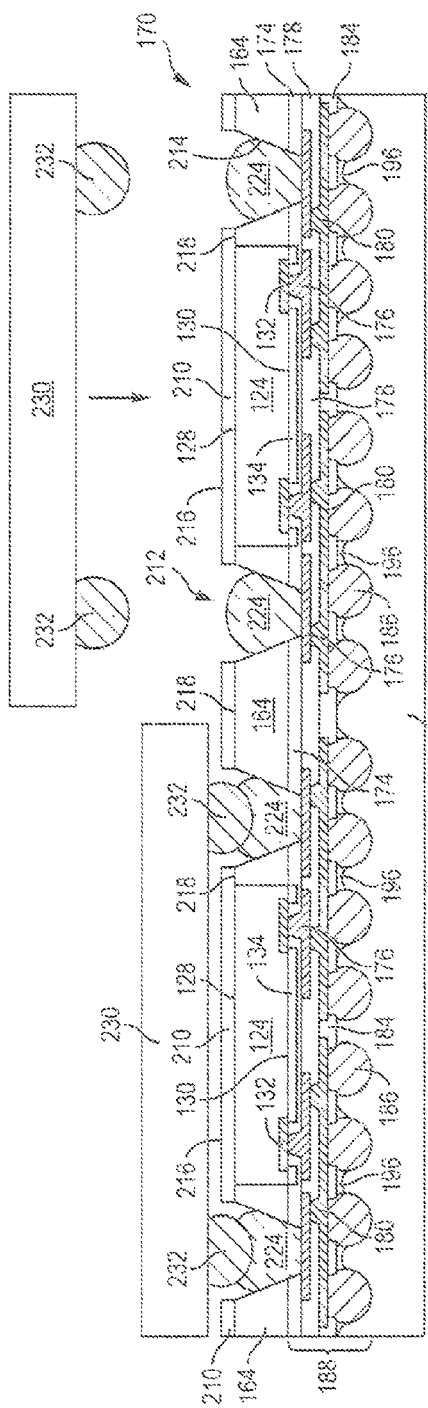

FIG. 4m shows a bumped semiconductor device or package 230 with bumps 232 being mounted over composite substrate 170 at the wafer level and before singulation of the composite substrate. Bumps 232 are Al, Sn, Ni, Au, Ag, Pb, Bi, Cu, solder, and combinations thereof, with an optional flux solution. In one embodiment, flux such as a non-clean flux is applied to bumps 232 of semiconductor package 230 in a flux dipping process. Alternatively, flux or solder paste is applied in openings 212 over bumps 224 and flux is not applied to bumps 232 of semiconductor package 230. Bumps 232 can be eutectic Sn/Pb, high-lead solder, or lead-free solder. Semiconductor device 230 is mounted using pick and place or other suitable operation. Semiconductor device 230 is mounted with bumps 232 oriented toward composite substrate 170 such that bumps 232 extend into openings 212 and contact bumps 224 within openings 212. The contact between bumps 232 and bumps 224 results in an offset between semiconductor device 230 and surface 216 of warpage balance layer 210 and surface 218 of encapsulant 164. A footprint of semiconductor device 230 has an area that is larger than an area of a footprint of semiconductor die 124. Thus, the footprint of semiconductor die 124 is located within the footprint of semiconductor device 230 after the semiconductor device has been mounted to bumps 224. In one embodiment, the footprint of semiconductor device 230 is substantially equal to a footprint of interconnect layer 188.

In FIG. 4n, composite substrate 170 and semiconductor devices 230 are heated to reflow bumps 224 and bumps 232. In one embodiment, bumps 224 and 232 are reflowed by heating the bump materials above their melting points to form spherical balls or bumps 236. In some applications, bumps 236 are reflowed a second time, or alternatively, are compression bonded. Bumps 236 represent one type of interconnect structure that can be formed between semiconductor devices 230 and conductive layer 176. The interconnect structure can also use bond wires, conductive paste, stud bump, micro bump, or other electrical interconnect. After bumps 224 and bumps 232 are reflowed to form bumps 236, non-clean flux residue 238 is disposed around bumps 236 and within openings 212. In one embodiment, non-clean flux residue 238 includes polymer.

After the formation of bumps 236, composite substrate 170, interconnect structure 188, mechanical support layer 196, and warpage balance layer 210 are singulated with saw blade or laser cutting device 240 into individual 3-D fo-PoPs 242. Fo-PoPs 242 are singulated before carrier 202 is removed by chemical etching, mechanical peeling, CMP, mechanical grinding, thermal bake, UV light, laser scanning, wet stripping, or other suitable process. Alternatively, carrier 202 is removed after completing the grinding of encapsulant 164 and after the formation and cleaning of openings 212 but before singulation.

FIG. 5 shows an individual fo-PoP 242 after singulation and separation from carrier 202. Fo-PoP 242 provides 3-D electrical vertical interconnection through interconnect structure 188 and bumps 236 that are formed outside a footprint of semiconductor die 124 and laterally offset from semiconductor die 124. Thus, the vertical interconnect is formed without the use of a backside RDL extending within a footprint of the semiconductor die. Interconnect structure 188 is formed over active surface 130 of semiconductor die 124 and over encapsulant 164 around the periphery of the semiconductor die. The interconnect structure includes insulation and conductive layers that form a fan-out interconnect structure and includes elements that would otherwise be included in a backside interconnect structure.

Fo-PoP 242 includes mechanical support layer 196 that enhances the mechanical base of interconnect structure 188, which as a thin stack of redistribution layers can be insufficient for supporting the formation of openings 212 and for stresses resulting from an offset between the TEVs and bumps 186. Mechanical support layer 196 also enhances the mechanical base supporting TEV interconnections during the formation of conductive TEVs, stacking of packages for a PoP structure, and singulation of composite substrate 170 into individual fo-PoP devices. Specifically, mechanical support layer 196 renders interconnect structure 188 more robust by providing additional structural support at corners of the semiconductor die and at corners of PoP device, which in board level reliability tests (BLRTs), and especially temperature cycling tests, were demonstrated to be the weakest points of the PoP device. Other common areas for the formation of mechanical support layer 196 include around a periphery of semiconductor die 124 in area 190, and at an interface between areas 190 and 192, i.e. along a perimeter of a footprint of the semiconductor die. By forming mechanical support layer 196 only over areas that require additional mechanical support for reliability and subsequent processing, a risk of increasing substrate warpage due to the presence of the mechanical support layer is minimized. Mechanical support layer 196 is made of materials that have the properties of good adhesion with insulating layer 184 and bumps 186, have low shrinkage, and have CTEs similar to those of interconnect structure 188. Mechanical support layer 196 is selectively applied and formed over interconnect structure 188 in areas that require additional mechanical strength or support for processing and reliability. Accordingly, mechanical support layer 196 is depopulated or disposed only in designated areas rather than being blanket deposited and left to cover an entire surface of areas 190 and 192.

Warpage balance layer 210 is deposited over and contacts a back surface 128 of semiconductor die 124 and encapsulant 164 to provide physical support, control overall package warpage, and environmentally protect the semiconductor die from external elements and contaminants. Warpage balance layer 210 provides structural support for the package, balances stress on the package, and reduces warping or cracking of the package during subsequent handling and processing.

After bumps 224 and bumps 232 are reflowed to form bumps 236, a flux residue 238 is disposed around bumps 236 and within openings 212. In one embodiment, flux such as a non-clean flux is applied to bumps 232 of semiconductor package 230 in a flux dipping process. Alternatively, flux or solder paste is applied in openings 212 over bumps 224 and flux is not applied to bumps 232 of semiconductor package 230. Flux residue serves to enhance bump reliability and thereby contributes to the formation of a more robust fo-PoP device.

Figure 6:
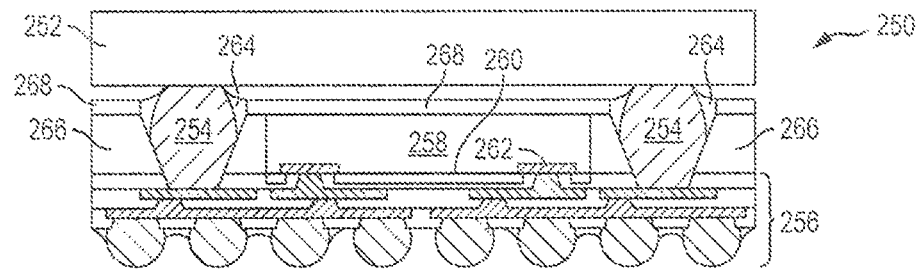
FIG. 6 illustrates another embodiment of a robust fo-PoP.

FIG. 6 shows a fo-PoP 250 similar to fo-PoP 242 from FIG. 5. In fo-PoP 250, semiconductor device 252 is mounted to interconnect structure 256 with bumps 254. Interconnect structure 256 is similar to interconnect structure 188, and can include any number of insulating and conductive layers to facilitate electrical interconnect with respect to semiconductor die 258 and points external to the semiconductor die. The number of insulating and conductive layers included within interconnect structure 256 depends on, and varies with, the complexity of the circuit routing design.

Semiconductor die 258 is similar to semiconductor die 124 from FIG. 3c. Semiconductor die 258 has an active surface 260 containing analog or digital circuits implemented as active devices, passive devices, conductive layers, and dielectric layers formed within the die and electrically interconnected according to the electrical design and function of the die. An electrically conductive layer 262 is formed over active surface 260 and operates as contact pads that are electrically connected to the circuits on active surface 260, and to interconnect structure 256. Semiconductor device 252, similar to semiconductor device 230, is electrically connected to semiconductor die 258 through conductive bumps 254 and interconnect structure 256.

FIG. 6 differs from FIG. 5 by the inclusion of bump protection flux 264. Bump protection flux 264 is similar to non-clean flux residue 238 of FIG. 5 in that both protection flux 264 and non-clean flux residue 238 are formed at least in part by flux formed over the bumps of semiconductor devices 230 and 252 by flux dipping, or by printing flux in TEVs in encapsulant 164 or 266 and warpage balance layers 210 or 268. Unlike non-clean flux residue 238, bump protection flux 264 in FIG. 6 is formed by applying flux material with polymer that is left in the TEVs around bumps 254. Bump protection flux 264 enhances reliability of a mechanical connection between bump 254, semiconductor device 252, and interconnect structure 256 by providing a robust connection. Bump protection flux 264 is formed around bumps 254 and fills the TEVs around bumps 254 and contacts encapsulant 266 and warpage balance layer 268, which enhances package strength with respect to both package assembly and reliability of the completed fo-PoP 250.

Figure 7A:
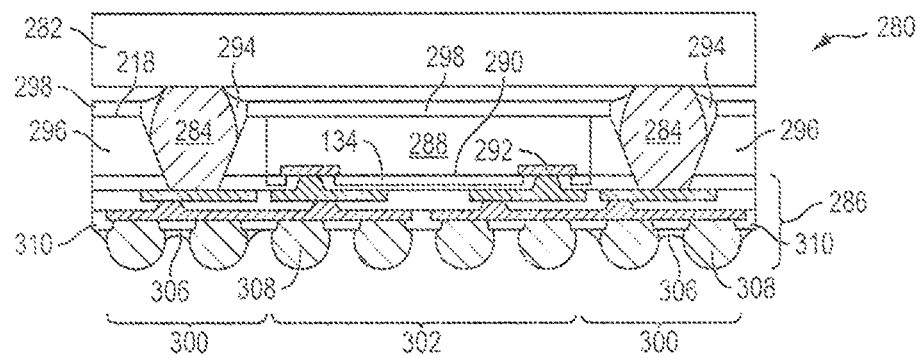
FIGS. 7a-7b illustrate another embodiment of a robust fo-PoP with a mechanical support layer around a periphery of a semiconductor die.

FIG. 7a shows a fo-PoP 280 similar to fo-PoP 250 from FIG. 6. In fo-PoP 280, semiconductor device 282 is mounted to interconnect structure 286 with bumps 284. Interconnect structure 286 is similar to interconnect structure 256, and can include any number of insulating and conductive layers to facilitate electrical interconnect with respect to semiconductor die 288 and points external to the semiconductor die. The number of insulating and conductive layers included within interconnect structure 286 depends on, and varies with, the complexity of the circuit routing design.

Semiconductor die 288 is similar to semiconductor die 258 from FIG. 6. Semiconductor die 288 has an active surface 290 containing analog or digital circuits implemented as active devices, passive devices, conductive layers, and dielectric layers formed within the die and electrically interconnected according to the electrical design and function of the die. An electrically conductive layer 292 is formed over active surface 290 and operates as contact pads that are electrically connected to the circuits on active surface 290, and to interconnect structure 286. Semiconductor device 282 is electrically connected to semiconductor die 288 through conductive bumps 284 and interconnect structure 286.

FIG. 7a also includes bump protection flux 294 similar to bump protection flux 264 in FIG. 6. Bump protection flux 294 is formed around bumps 284 and fills the TEVs around bumps 284 thereby contacting encapsulant 296 and warpage balance layer 298. Bump protection flux 294 also completely covers bumps 284 and extends to a bottom surface of semiconductor device 282. In one embodiment, bump protection flux 294 is formed by applying flux material with polymer that is left in the TEV around bumps 284. Bump protection flux 294 enhances reliability of a mechanical connection between bump 284, semiconductor device 282, and interconnect structure 286 by providing a robust connection that enhances package strength with respect to both package assembly, and reliability of completed fo-PoP 280.

Interconnect structure 286 includes a first area 300 that is disposed over encapsulant 296 and outside a footprint of semiconductor die 288 at a surface of the interconnect structure. Interconnect structure 286 also includes a second area 302 that is disposed at the surface of interconnect structure 286 adjacent to area 300 and within the footprint of semiconductor die 288. Accordingly, area 300 includes an entire surface of interconnect structure 286 for a fan-out package or area not included within area 302.

A mechanical support layer 306 is formed over interconnect structure 286 and around a number of bumps 308 using printing, spin coating, spray coating, screen printing, stencil printing, jetting, lamination, or other suitable process. An optional cleaning process such as a laser clean, dry plasma, or wet development may also be used. Materials of mechanical support layer 306 include one or more layers of photosensitive polymer dielectric film with or without fillers, photosensitive composite resist, non-photosensitive polymer dielectric film, LCP, laminate compound film, insulation paste with filler, liquid molding compound, granular molding compound, polyimide, polymer flux, underfill, or other material having similar insulating and structural properties. Mechanical support layer 306 provides structural support for fo-PoP 280, balances stress on the fo-PoP, and reduces warping or cracking of the fo-PoP. Mechanical support layer 306 is made of materials that have the properties of good adhesion with insulating layer 310 and bumps 308, have low shrinkage, and have a CTE similar to that of interconnect structure 286. In one embodiment, mechanical support layer 306 has a CTE in a range of 15-80 ppm/degree C.

Mechanical support layer 306 is selectively applied and formed over interconnect structure 286 in areas that require additional mechanical strength or support for processing or reliability. Accordingly, mechanical support layer 306 is only disposed in designated areas and is not blanket deposited and left to cover an entire surface of areas 300 and 302. Mechanical support layer 306 is formed around a periphery of semiconductor die 288 within area 300, and within a footprint of bumps 284. By forming mechanical support layer 306 within area 300, the mechanical support layer provides additional mechanical support for TEV zones or areas in which bumps 284 extend through encapsulant 296 to contact interconnect structure 286. Accordingly, FIG. 7a shows an embodiment in which mechanical support layer 306 is formed at corner regions of fo-PoP 280 or area 300, but is not formed at corner regions of semiconductor die 288 or area 302. By forming mechanical support layer 306 only over areas that require additional mechanical support for reliability and subsequent processing, a risk of increasing substrate warpage is minimized.

Figure 7B:
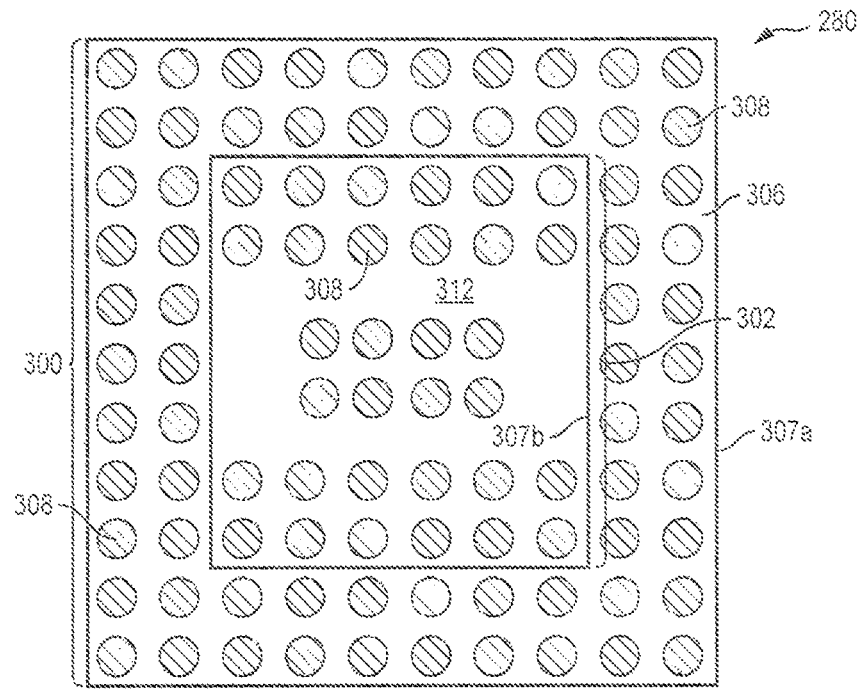

FIG. 7b shows a plan or top view of fo-PoP 280 that corresponds to the cross-sectional view of fo-PoP 280 previously shown in FIG. 7a. Mechanical support layer 306 is disposed within area 300 and is not disposed within area 302. Mechanical support layer 306 is disposed along the interface between areas 300 and 302, as well as at corners of area 300 for additional mechanical support during subsequent processing and for increased reliability. Because area 302 is free of mechanical support layer 306, a risk of increasing substrate warpage is minimized.

Figure 8A:
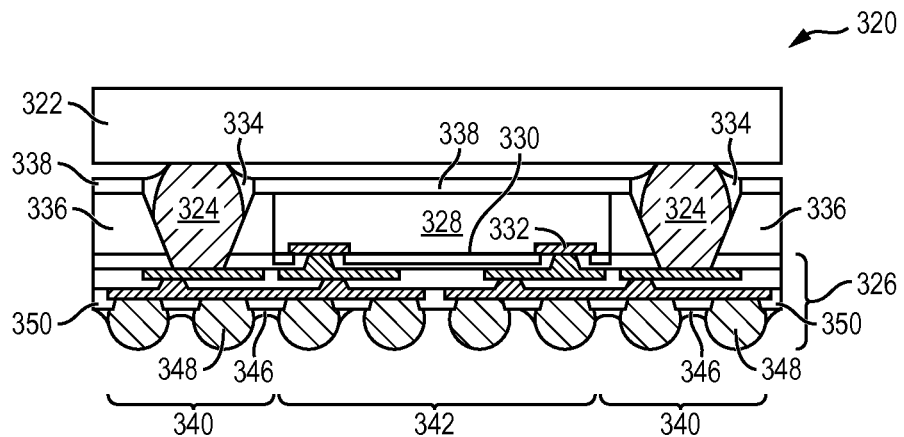
FIGS. 8a-8b illustrate another embodiment of a robust fo-PoP with a mechanical support layer disposed at package and semiconductor die corners.

FIG. 8a shows a fo-PoP device 320 similar to fo-PoP 280 from FIG. 7a. In fo-PoP 320, semiconductor device 322 is mounted to interconnect structure 326 with bumps 324. Interconnect structure 326 is similar to interconnect structure 286, and can include any number of insulating and conductive layers to facilitate electrical interconnect with respect to semiconductor die 328 and points external to the semiconductor die. The number of insulating and conductive layers included within interconnect structure 326 depends on, and varies with, the complexity of the circuit routing design.

Semiconductor die 328 is similar to semiconductor die 288 from FIG. 7a. Semiconductor die 328 has an active surface 330 containing analog or digital circuits implemented as active devices, passive devices, conductive layers, and dielectric layers formed within the die and electrically interconnected according to the electrical design and function of the die. An electrically conductive layer 332 is formed over active surface 330 and operates as contact pads that are electrically connected to the circuits on active surface 330, and to interconnect structure 326. Semiconductor device 322 is electrically connected to semiconductor die 328 through conductive bumps 324 and interconnect structure 326.

FIG. 8a also includes bump protection flux 334 similar to bump protection flux 394 in FIG. 7a. Bump protection flux 334 is formed around bumps 324 and fills the TEVs around bumps 324 thereby contacting encapsulant 336 and warpage balance layer 338. Bump protection flux 334 also completely covers bumps 324 and extends to a bottom surface of semiconductor device 322. In one embodiment, bump protection flux 334 is formed by applying flux material with polymer that is left in the TEV around bumps 324. Bump protection flux 334 enhances reliability of a mechanical connection between bump 324, semiconductor device 322, and interconnect structure 326 by providing a robust connection that enhances package strength with respect to both package assembly, and reliability of completed fo-PoP 320.

Interconnect structure 326 includes a first area 340 that is disposed over encapsulant 336 and outside a footprint of semiconductor die 328 at a surface of the interconnect structure. Interconnect structure 326 also includes a second area 342 that is disposed at the surface of interconnect structure 326 adjacent to area 340 and within the footprint of semiconductor die 328. Accordingly, area 340 includes an entire surface of interconnect structure 326 for a fan-out package or area not included within area 342.

A mechanical support layer 346 is formed over interconnect structure 326 and around a number of bumps 348 using printing, spin coating, spray coating, screen printing, stencil printing, jetting, lamination, or other suitable process. An optional cleaning process such as a laser clean, dry plasma, or wet development may also be used. Materials of mechanical support layer 346 include one or more layers of photosensitive polymer dielectric film with or without fillers, photosensitive composite resist, non-photosensitive polymer dielectric film, LCP, laminate compound film, insulation paste with filler, liquid molding compound, granular molding compound, polyimide, polymer flux, underfill, or other material having similar insulating and structural properties. Mechanical support layer 346 provides structural support for the package, balances stress on the package, and reduces warping or cracking of the package. Mechanical support layer 346 is made of materials that have the properties of good adhesion with insulating layer 350 and bumps 348, have low shrinkage, and have a CTE similar to that of interconnect structure 326. In one embodiment, mechanical support layer 346 has a CTE in a range of 15-80 ppm/degree C.

Mechanical support layer 346 is selectively applied and formed over interconnect structure 326 in areas that require additional mechanical strength or support for processing or reliability. Accordingly, mechanical support layer 346 is only disposed in designated areas and is not blanket deposited and left to cover an entire surface of areas 340 and 342. In FIG. 8a, mechanical support layer 346 is formed at corner regions of semiconductor die 328 or area 342, and at corner regions of fan-out package 320 or area 340. By forming mechanical support layer 346 only over areas that require additional mechanical support for reliability and subsequent processing, a risk of increasing substrate warpage is minimized.

Figure 8B:
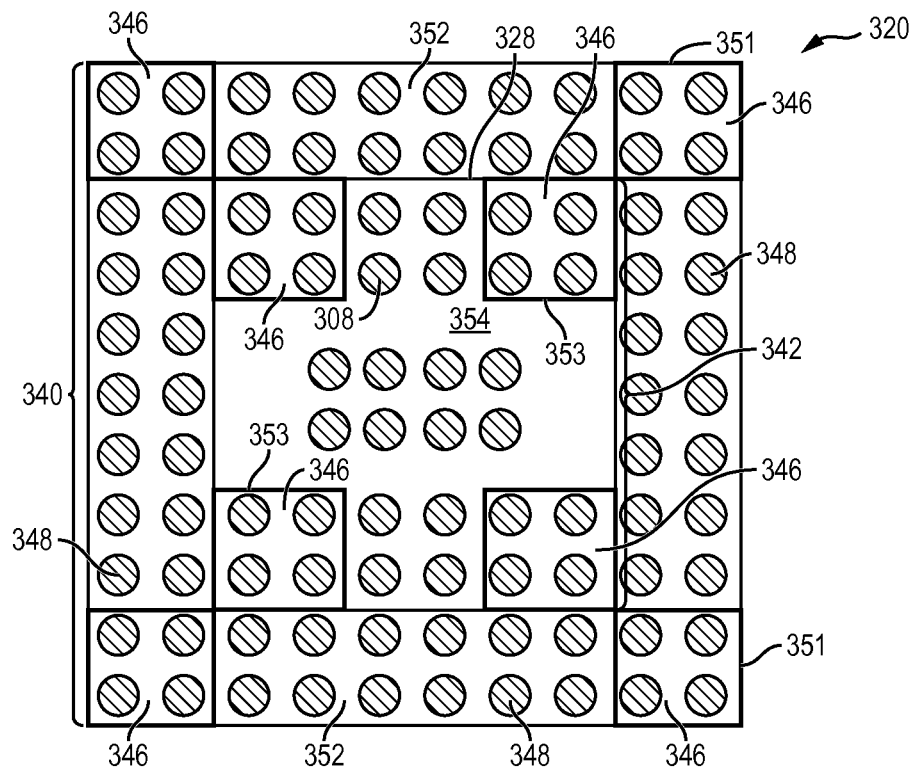

FIG. 8b shows a plan or top view of fo-PoP 320 that corresponds to the cross-sectional view of fo-PoP 320 previously shown in FIG. 8a. In FIG. 8b, mechanical support layer 346 is disposed within critical areas for additional mechanical support during subsequent processing and for increased reliability. Specifically, mechanical support layer 346 is disposed at package corners 351 within area 340 but is not formed in the remaining portions 352 of area 340. In one embodiment, mechanical support layer 346 is disposed around four bumps 348 at each package corner 351. Similarly, mechanical support layer 346 is also disposed at corners 353 of area 342, which is within a footprint of, and corresponds to, corners of semiconductor die 328. Mechanical support layer 346 is not disposed within a center portion 354 of area 342. In one embodiment, mechanical support layer 346 is disposed around four bumps 348 at each corner 353, i.e. located within a footprint of the corners of semiconductor die 328. Benefits of forming mechanical support layer 346 only over corners 351 and 353 while leaving areas 352 and 354 free of mechanical support layer 346 include increasing strength and reliability of fo-PoP 320, and reducing or minimizing a risk of increasing package and substrate warpage. The benefits of mechanical support layer 346 are particularly pronounced with respect to applications involving temperature cycling.

Figure 9A:
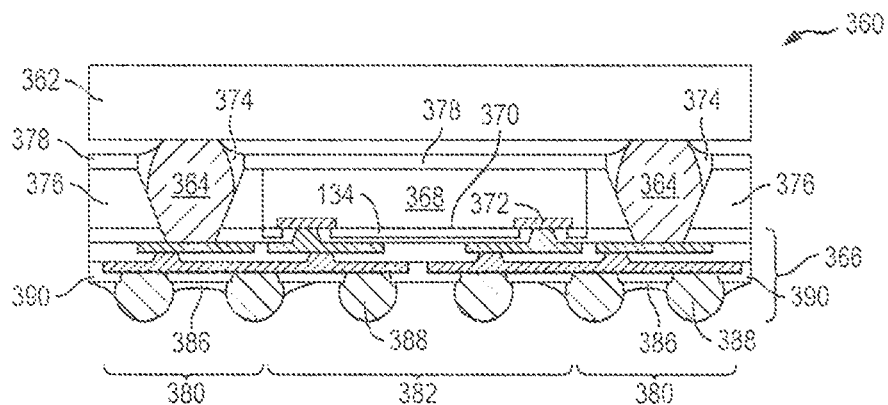
FIGS. 9a-9b illustrate another embodiment of a robust fo-PoP with a mechanical support layer disposed along a periphery of the semiconductor die.

FIG. 9a shows a fo-PoP 360 similar to fo-PoP 320 from FIG. 8a. In fo-PoP 360, semiconductor device 362 with bumps 364 is mounted to interconnect structure 366. Interconnect structure 366 is similar to interconnect structure 326, and can include any number of insulating and conductive layers to facilitate electrical interconnect with respect to semiconductor die 368 and points external to the semiconductor die. The number of insulating and conductive layers included within interconnect structure 366 depends on, and varies with, the complexity of the circuit routing design.

Semiconductor die 368 is similar to semiconductor die 328 from FIG. 8a. Semiconductor die 368 has an active surface 370 containing analog or digital circuits implemented as active devices, passive devices, conductive layers, and dielectric layers formed within the die and electrically interconnected according to the electrical design and function of the die. An electrically conductive layer 372 is formed over active surface 370 and operates as contact pads that are electrically connected to the circuits on active surface 370, and to interconnect structure 366. Semiconductor device 362 is electrically connected to semiconductor die 368 through conductive bumps 364 and interconnect structure 366.

FIG. 9a also includes bump protection flux 374 similar to bump protection flux 334 in FIG. 8a. Bump protection flux 374 is formed around bumps 364 and fills the TEVs around bumps 364 thereby contacting encapsulant 376 and warpage balance layer 378. Bump protection flux 374 also completely covers bumps 364 and extends to a bottom surface of semiconductor device 362. In one embodiment, bump protection flux 374 is formed by applying flux material with polymer that is left in the TEV around bumps 364. Bump protection flux 374 enhances reliability of a mechanical connection between bump 364, semiconductor device 362, and interconnect structure 366 by providing a robust connection that enhances package strength with respect to both package assembly, and reliability of completed fo-PoP 360.

Interconnect structure 366 includes a first area 380 that is disposed over encapsulant 376 and outside a footprint of semiconductor die 368 at a surface of the interconnect structure. Interconnect structure 366 also includes a second area 382 that is disposed at the surface of interconnect structure 366 adjacent to area 380 and within the footprint of semiconductor die 368. Accordingly, area 380 includes an entire surface of interconnect structure 366 for a fan-out package or area not included within area 382.

A mechanical support layer 386 is formed over interconnect structure 366 and around a number of bumps 388 using printing, spin coating, spray coating, screen printing, stencil printing, jetting, lamination, or other suitable process. An optional cleaning process such as a laser clean, dry plasma, or wet development may also be used. Materials of mechanical support layer 386 include one or more layers of photosensitive polymer dielectric film with or without fillers, photosensitive composite resist, non-photosensitive polymer dielectric film, LCP, laminate compound film, insulation paste with filler, liquid molding compound, granular molding compound, polyimide, polymer flux, underfill, or other material having similar insulating and structural properties. Mechanical support layer 386 provides structural support for the package, balances stress on the package, and reduces warping or cracking of the package. Mechanical support layer 386 is made of materials that have the properties of good adhesion with insulating layer 390 and bumps 388, have low shrinkage, and have a CTE similar to that of interconnect structure 366. In one embodiment, mechanical support layer 386 has a CTE in a range of 15-80 ppm/degree C.

Mechanical support layer 386 is selectively applied and formed over interconnect structure 366 in areas that require additional mechanical strength or support for processing or reliability. Accordingly, mechanical support layer 386 is only disposed in designated areas and is not blanket deposited and left to cover an entire surface of areas 380 and 382. In FIG. 9a, mechanical support layer 386 is formed at corner regions of semiconductor die 368 or area 382, at corner regions of fan-out package 360 or area 380, and around bumps overlapping an edge of the footprint of semiconductor die 368 or at an interface between areas 380 and 382. By forming mechanical support layer 386 only over areas that require additional mechanical support for reliability and subsequent processing a risk of increasing substrate warpage is minimized.

Figure 9B:
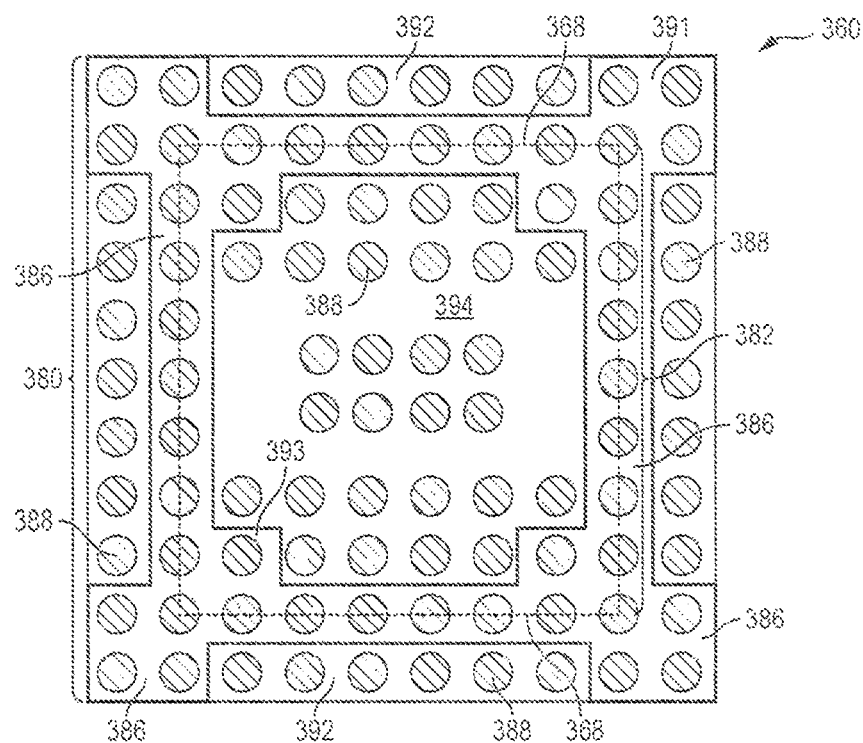

FIG. 9b shows a plan or top view of fo-PoP 360 that corresponds to the cross-sectional view of fo-PoP 360 previously shown in FIG. 9a. In FIG. 9b, mechanical support layer 386 is disposed within critical areas for additional mechanical support during subsequent processing and for increased reliability. Specifically, mechanical support layer 386 is disposed at package corners 391 within area 380 but is not formed in the remaining portions 392 of area 380. In one embodiment, mechanical support layer 386 is disposed around a number of bumps 388 at each package corner 391. Similarly, mechanical support layer 386 is also disposed at corners 393 of area 382, which is within a footprint of, and corresponds to, corners of semiconductor die 368. Mechanical support layer 386 is not disposed within a center portion 394 of area 382. In one embodiment, mechanical support layer 386 is disposed around a number of bumps 388 at each corner 393, i.e. located within a footprint of the corners of semiconductor die 368. Mechanical support layer 386 is further disposed around bumps overlapping an edge of the footprint of semiconductor die 368 or at an interface between areas 380 and 382. A number of benefits result from forming mechanical support layer 386 only over corners 391, 393, and around bumps 388 overlapping an edge of the interface between areas 380 and 382 while leaving areas 392 and 394 free of mechanical support layer 386. The benefits include increasing strength and reliability of fo-PoP 360, and reducing or minimizing a risk of increasing package and substrate warpage. The benefits of mechanical support layer 386 are particularly pronounced with respect to applications involving temperature cycling.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
providing a semiconductor die;
depositing an encapsulant around the semiconductor die;
forming an interconnect structure including a conductive bump over the encapsulant and semiconductor die;
forming a mechanical support layer over the interconnect structure and around the conductive bump;
forming an opening through the encapsulant that extends to the interconnect structure after forming the mechanical support layer; and
depositing conductive material within the opening to form a conductive through encapsulant via (TEV) coupled to the interconnect structure.

2. The method of claim 1, further including disposing a semiconductor component over the TEV and over the semiconductor die to form a package-on-package device.

3. The method of claim 2, further including forming flux around the conductive material within the opening.

4. The method of claim 1, further including forming the mechanical support layer over a corner of the semiconductor die and over a corner of the interconnect structure.

5. The method of claim 1, further including forming the mechanical support layer over a first portion of the interconnect structure outside a footprint of the semiconductor die such that a second portion of the interconnect structure within the footprint of the semiconductor die is devoid of the mechanical support layer.

6. The method of claim 1, further including forming the mechanical support layer partially outside a footprint of the semiconductor die and partially within the footprint of the semiconductor die.

7. A method of making a semiconductor device, comprising:
providing a semiconductor die;
depositing an encapsulant around the semiconductor die;
forming an interconnect structure including a conductive bump over the encapsulant and semiconductor die;
forming a mechanical support layer over the interconnect structure and around the conductive bump; and
forming a through encapsulant via (TEV) through the encapsulant over the mechanical support layer.

8. The method of claim 7, wherein forming the TEV further includes:
forming an opening through the encapsulant;
forming a conductive material within the opening; and
forming flux around the conductive material.

9. The method of claim 7, further including forming the mechanical support layer over a corner of the semiconductor die and over a corner of the interconnect structure.

10. The method of claim 7, further including forming the mechanical support layer over a first portion of the interconnect structure outside a footprint of the semiconductor die such that a second portion of the interconnect structure within the footprint of the semiconductor die is devoid of the mechanical support layer.

11. The method of claim 7, further including forming the mechanical support layer partially outside a footprint of the semiconductor die and partially within the footprint of the semiconductor die.

12. The method of claim 7, wherein forming the interconnect structure includes:
depositing a first insulating layer over the semiconductor die and over the encapsulant;
depositing a conductive layer over the first insulating layer;
depositing a second insulating layer over the conductive layer; and
forming the conductive bump over the second insulating layer and electrically connected to the conductive layer.

13. The method of claim 7, further including forming a warpage balance layer over the encapsulant opposite the interconnect structure.

14. A method of making a semiconductor device, comprising:
  providing a semiconductor die;
  depositing an encapsulant around the semiconductor die;
  forming an interconnect structure over the encapsulant and semiconductor die;
  forming a mechanical support layer over the interconnect structure; and
  forming an opening in the encapsulant over the mechanical support layer.

15. The method of claim 14, further including depositing conductive material within the opening to form a through encapsulant via (TEV) electrically connected to the interconnect structure.

16. The method of claim 15, further including disposing a semiconductor component over the TEV and over the semiconductor die to form a package-on-package device.

17. The method of claim 14, further including forming the mechanical support layer over a corner of the semiconductor die and over a corner of the interconnect structure.

18. The method of claim 14, further including forming the mechanical support layer over a first portion of the interconnect structure outside a footprint of the semiconductor die such that a second portion of the interconnect structure within the footprint of the semiconductor die is void of the mechanical support layer.

19. The method of claim 14, further including forming the mechanical support layer partially outside a footprint of the semiconductor die and partially within the footprint of the semiconductor die.

20. The method of claim 14, wherein forming the interconnect structure includes:
  depositing a first insulating layer over the semiconductor die and over the encapsulant;
  depositing a conductive layer over the first insulating layer;
  depositing a second insulating layer over the conductive layer; and
  forming a conductive bump over the second insulating layer and electrically connected to the conductive layer.

21. A method of making a semiconductor device, comprising:
  providing a semiconductor die;
  disposing an encapsulant around the semiconductor die;
  forming a mechanical support layer over the encapsulant; and
  forming a through encapsulant via (TEV) in the encapsulant over the mechanical support layer.

22. The method of claim 21, further including forming the mechanical support layer over a corner of the semiconductor die and over a corner of the encapsulant.

23. The method of claim 21, further including forming the mechanical support layer over a first portion of the encapsulant outside a footprint of the semiconductor die with a second portion of the encapsulant within the footprint of the semiconductor die being devoid of the mechanical support layer.

24. The method of claim 21, further including forming the mechanical support layer partially outside a footprint of the semiconductor die and partially within the footprint of the semiconductor die.

25. The method of claim 21, further including forming a warpage balance layer over the encapsulant opposite the encapsulant.

* * * * *